United States Patent
Katsumata et al.

(10) Patent No.: US 7,749,851 B2
(45) Date of Patent: Jul. 6, 2010

(54) SEMICONDUCTOR DEVICE AND METHOD FOR FABRICATING SEMICONDUCTOR DEVICE

(75) Inventors: Ryota Katsumata, Kanagawa-ken (JP); Hideaki Aochi, Kanagawa-ken (JP); Masaru Kidoh, Kanagawa-ken (JP); Masaru Kito, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 220 days.

(21) Appl. No.: 11/868,051

(22) Filed: Oct. 5, 2007

(65) Prior Publication Data
US 2008/0087957 A1    Apr. 17, 2008

(30) Foreign Application Priority Data
Oct. 5, 2006  (JP) .............................. 2006-274447

(51) Int. Cl.
*H01L 21/336* (2006.01)
(52) U.S. Cl. .................... 438/302; 438/514; 438/525; 438/527; 257/E21.058; 257/E21.059; 257/E21.334
(58) Field of Classification Search .................. 438/515, 438/548, 914; 257/E21.058, E21.059, E21.147, 257/E21.473, E21.474
See application file for complete search history.

(56) References Cited

U.S. PATENT DOCUMENTS 5,595,919 A * 1/1997 Pan ............................ 438/302
6,713,360 B2   3/2004 Jain et al.
6,822,297 B2   11/2004 Nandakumar et al.
2005/0130381 A1 * 6/2005 Kim ............................ 438/305

FOREIGN PATENT DOCUMENTS

JP    2005-327848    11/2005

* cited by examiner

*Primary Examiner*—Charles D Garber
*Assistant Examiner*—Cheung Lee
(74) *Attorney, Agent, or Firm*—Banner & Witcoff, Ltd.

(57) ABSTRACT

According to the present invention, there is provided a semiconductor device including a first conductive type semiconductor substrate, a gate electrode formed over the semiconductor substrate via a gate insulator, a first conductive impurity region buried in the semiconductor substrate, the first conductive impurity region being both sides of an extend plane, the extend plane being extended from side-walls of the gate electrode into the semiconductor substrate and a second conductive type source/drain region partially overlapping with the first conductive impurity region and extending from an end of the gate electrode at the semiconductor substrate to an outer region in the semiconductor substrate, wherein a first conductive impurity concentration at a prescribed depth in the overlapping portion between the first conductive impurity region and the source/drain region is lower than the first conductive impurity concentration in the first conductive impurity region except the overlapping portion corresponding to the prescribed depth.

3 Claims, 4 Drawing Sheets

SEMICONDUCTOR DEVICE AND METHOD FOR FABRICATING SEMICONDUCTOR DEVICE

CROSS REFERENCE TO RELATED APPLICATION

This application is based upon and claims the benefit of priority from the prior Japanese Patent Application No. JP2006-274447, filed Oct. 5, 2006, the entire contents of which are incorporated herein by reference.

FIELD OF THE INVENTION

The present invention relates to a semiconductor device for high speed operation and a method for fabricating the semiconductor device.

DESCRIPTION OF THE BACKGROUND

Recently, high speed operation as well as large scale integration and high packing density in an integrated circuit has been strongly demanded. For realization of this demand, an improvement of the high speed operation on a semiconductor device such as a MOSFET (Metal Oxide Semiconductor Field Effect Transistor) which is merely called transistor hereafter or the like has been important. For operation speed of the semiconductor device, for example, switching time Tpd of an inverter is generally represented as k×CV/I, where C is parasitic capacitor of the transistor, I is driving force, V is operation voltage and k is proportional constant.

Necessity for enlarging the driving force I or lowering the parasitic capacitor C is derived from the formula to obtain high speed operation, namely lowering the Tpd. The parasitic capacitor of the transistor is composed of a gate capacitor, a diffusion capacitor, a fringe capacitor and an overlapping capacitor. Shortening a gate length of the transistor leads to decreasing a resistance of a channel region so as to be able to increase the driving force I and to lower the gate capacitor.

However, shortening the gate length of the transistor causes a problem such as lowering a threshold voltage or being increased with an off current (leakage current) due to a short-channel effect.

As a technique for controlling the short-channel effect, a halo ion-implantation technique has been proposed. For example, Japanese Patent Publication (Kokai) No. 2005-327848 discloses a method for the technique. In the Patent Publication, after forming a source/drain region with a low concentration, ion-implanting a same conductive-type impurity as an impurity into the channel area from a direction with an angle for perpendicular to the semiconductor substrate using a gate electrode as a mask. The ion-implantation increases a channel concentration and shallows a channel depth so that the short-channel effect is suppressed.

However, the halo ion-implantation in this method is performed not only into a lower channel region of an end of the gate electrode for suppressing the short-channel effect but also into all over the source/drain region. Accordingly, all over the source/drain region becomes a high concentration which is the same as the channel area of the semiconductor substrate.

Therefore, increasing the diffusion layer capacity of the source/drain region and the resistance of the diffusion layer causes deterioration of the driving force. As a result, the switching operation Tpd of the transistor is also deteriorated.

SUMMARY OF THE INVENTION

According to an aspect of the invention, there is provided a semiconductor device including a first conductive type semiconductor substrate, a gate electrode formed over the semiconductor substrate via a gate insulator, a first conductive impurity region buried in the semiconductor substrate, the first conductive impurity region being both sides of an extend plane, the extend plane being extended from side-walls of the gate electrode into the semiconductor substrate and a second conductive type source/drain region partially overlapping with the first conductive impurity region and extending from an end of the gate electrode at the semiconductor substrate to an outer region in the semiconductor substrate, wherein a first conductive impurity concentration at a prescribed depth in the overlapping portion between the first conductive impurity region and the source/drain region is lower than the first conductive impurity concentration in the first conductive impurity region except the overlapping portion corresponding to the prescribed depth.

Further, another aspect of the invention, there is provided a method for fabricating a semiconductor device, including, forming a gate electrode over a surface of a first conductive type semiconductor substrate via a gate insulator, forming a mask over the surface of the semiconductor substrate, the mask having a space for a side-wall of the gate electrode, ion-implanting a first conductive impurity into the surface of the semiconductor substrate through the space from a direction inclined with a prescribed angles for perpendicular to the surface of the semiconductor substrate to form the first conductive impurity region, the first conductive impurity region being buried in the semiconductor substrate, the first conductive impurity region being extended at both sides of an extend plane, the extend plane being extended from both the side-wall sides of the gate electrode into the semiconductor substrate, and ion-implanting a second conductive impurity into the surface of the semiconductor substrate using the gate electrode as a mask to form a source/drain region, the source/drain region being extended from an end of the gate electrode at the semiconductor substrate to an outer region in the semiconductor substrate and the source/drain region being partially overlapped with the first conductive impurity region.

DETAILED DESCRIPTION OF THE INVENTION

An embodiment of the present invention will be described below in detail with reference to the drawings mentioned above.

Embodiment

First, according to an embodiment of the present invention, a structure of a semiconductor device is explained with reference to FIG. 1 being a schematic cross-section view.

Figure 1:
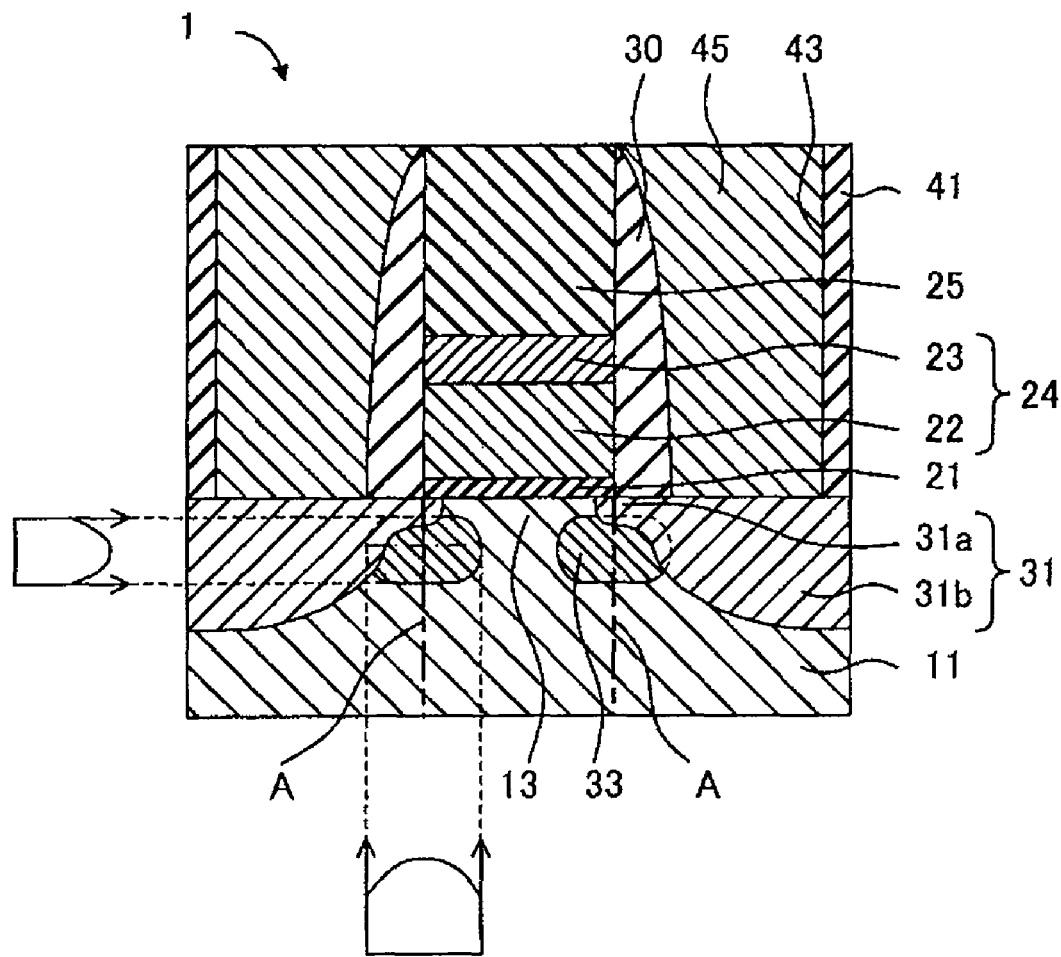
FIG. 1 is a schematic cross-section view showing a structure of a semiconductor device according to an embodiment of the present invention.

As shown in FIG. 1, a semiconductor device 1 includes a first conductive semiconductor substrate 11, a gate insulator 21, a gate electrode 24, a cap insulator 25, a spacer 30, a second conductive source/drain region 31, a first conductive impurity region 33 said as a halo-ion-implantation region, an inter-layer dielectric film 41 and a contact layer 45.

A gate electrode 24 is formed on a surface of the semiconductor substrate 11 with p-type, for example, via the gate insulator 21 composed of a silicon oxide film.

The gate electrode 24 is constituted of a lower portion gate electrode film 22 and an upper portion gate electrode film 23. The lower portion gate electrode 22 is composed of poly-crystalline silicon doped with phosphorous (P), for example, and the upper portion gate electrode 23 is composed of tungsten-silicon compound (WSi), for example.

The cap insulator 25 is composed of a silicon nitride film, for example, and is formed on the upper portion gate electrode film 23.

The spacer 30 is composed of a silicon nitride film, for example, and is formed to cover with side-walls of the gate insulator 21, the gate electrode 24 and the cap insulator 25.

A source/drain region 31 being an n-type, for example, as a second conductive type, is formed in the surface of the semiconductor substrate 11 to extend from an end of the gate electrode 24 to an outer region. The source/drain region 31 is constituted of a low concentration source/drain region 31a and a high concentration source/drain region 31b. The low concentration source/drain region 31a is formed in the surface of the semiconductor substrate 11 under the spacer 30 and is contacted with a channel area 13 under the gate electrode 24. The high concentration source/drain region 31b is formed an outer region of the spacer 30 to contact with the low concentration source/drain region 31a and at a region being deeper than the low concentration source/drain region 31a.

The first conductive impurity region 33 has the same conductive type as the semiconductor substrate 11 which means channel area 13, is composed of a p-type impurity, for example. The first conductive impurity region 33 is formed at both sides of an extend plane being extended from the side-walls of the gate electrode 24 into the semiconductor substrate 11. Further, the first conductive impurity region 33 is restrictedly formed in the surface of the semiconductor substrate 11 near the extend plane A. Namely, one portion of the first conductive impurity region 33 is formed at a side of the source/drain region 31 and the other region is formed at the side of the channel area 13. Furthermore, a part of the first conductive impurity region 33 is overlapped with the source/drain region 31. Further, the first conductive impurities region 33 has a concentration profile. In a depth direction perpendicular to the surface of the semiconductor substrate 11, the concentration profile is a mountain-type, namely, high at a center portion and low at a periphery portion at the left side in FIG. 1. Further, in a horizontal direction, as same as the depth direction to the surface of the semiconductor substrate 11, the concentration profile is also a mountain-type, namely, high at a center portion and low at a periphery portion at the lower side in FIG. 1.

Figure 2A:
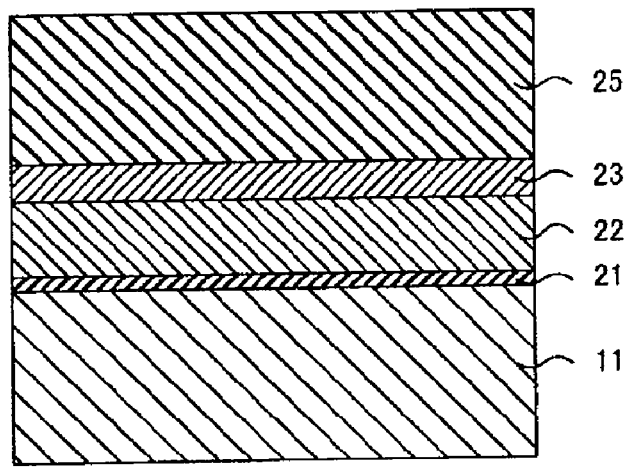
FIGS. 2A-2C are schematic cross-section views showing a fabricating process of the semiconductor device according to the embodiment of the present invention.
Figure 2B:
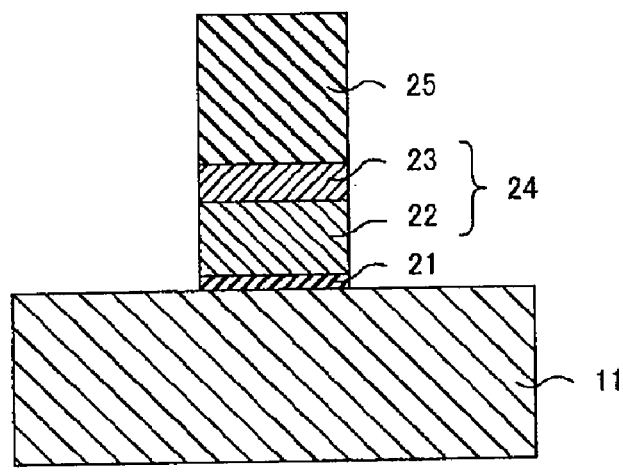
Figure 2C:
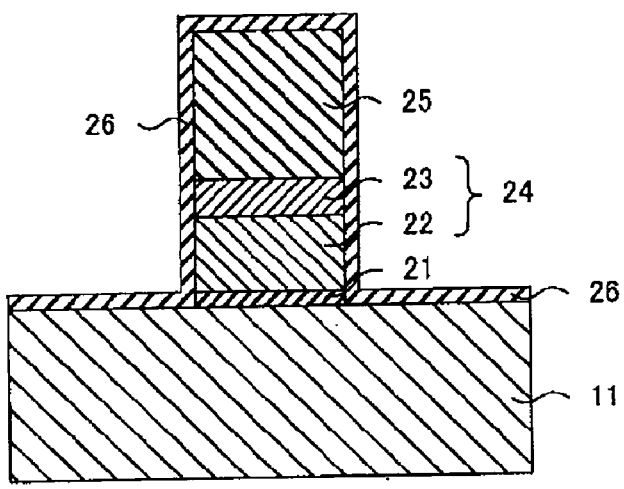
Figure 3A:
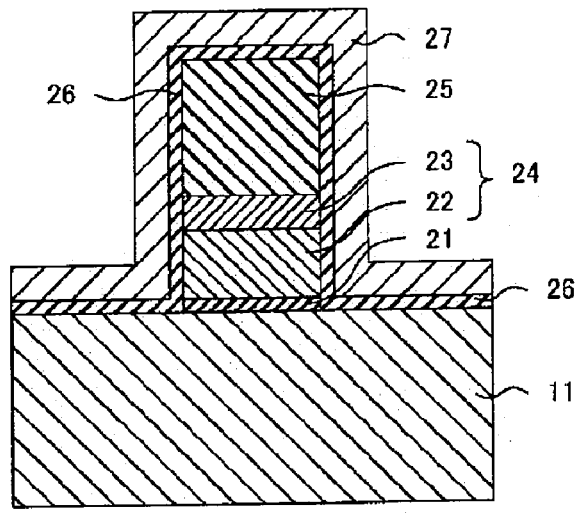
FIGS. 3A-3C are schematic cross-section views showing the fabricating process of the semiconductor device according to the embodiment of the present invention.
Figure 3B:
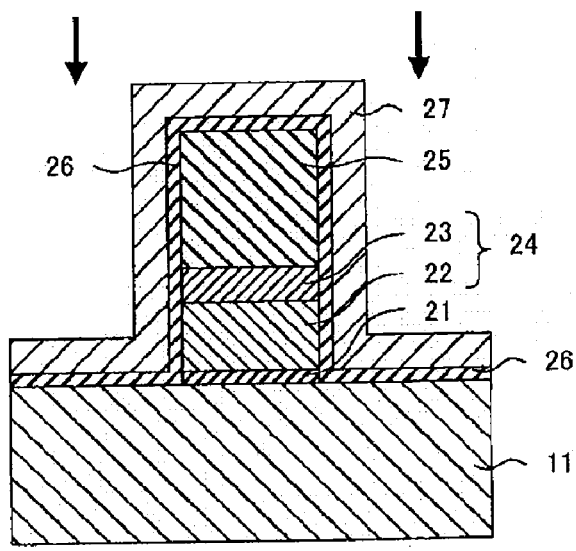
Figure 3C:
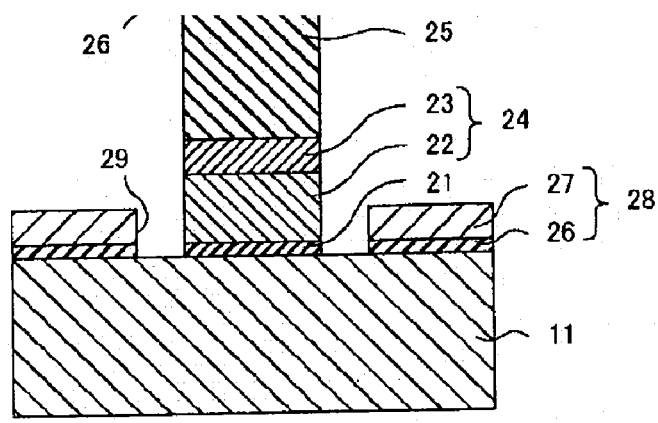
Figure 4A:
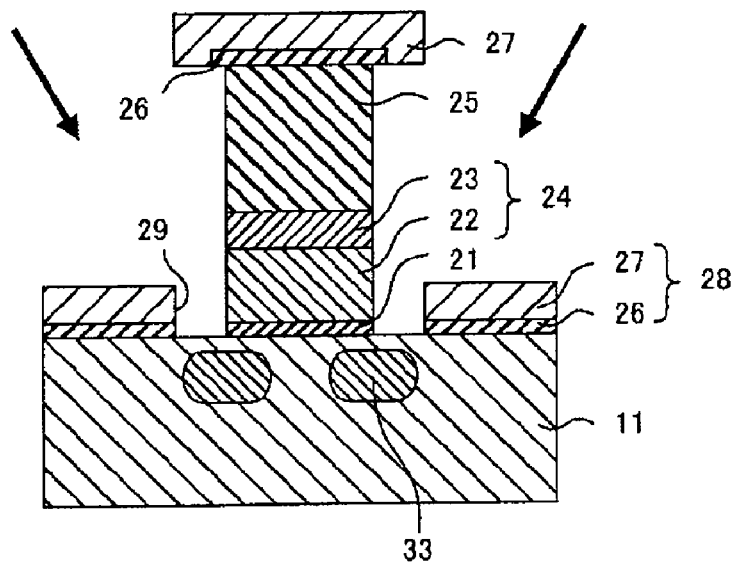
FIGS. 4A-4C are schematic cross-section views showing the fabricating process of the semiconductor device according to the embodiment of the present invention.
Figure 4B:
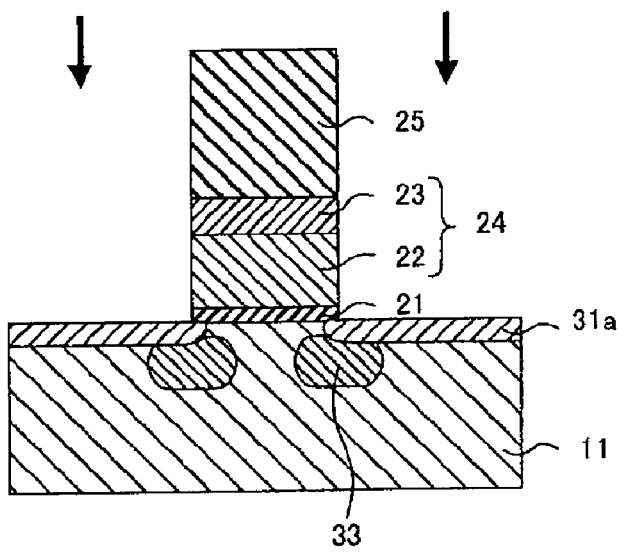
Figure 4C:
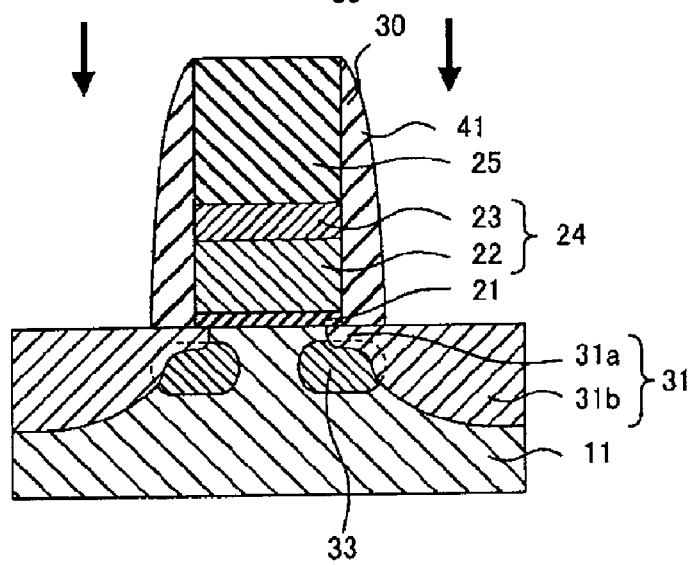

Next, according to the embodiment of the present invention, processing steps for fabricating the semiconductor device 1 with the structure mentioned above is explained with reference to FIGS. 2-4. FIGS. 2A-2C are schematic cross-section views showing a fabricating process of the semiconductor device 1. Successively, FIGS. 3A-3C are schematic cross-section views showing the fabricating process of the semiconductor device 1. Further successively, FIGS. 4A-4C are schematic cross-section views showing the fabricating process of the semiconductor device 1.

Generally, in a surface region of the semiconductor substrate 11, for example, an isolation area with a STI (Shallow Trench Isolation) structure is formed. Here, for simply describing, only the semiconductor substrate 11 in the isolation region is illustrated, on the other hand, the other portion is omitted.

As shown in FIG. 2, on the surface of the p-type semiconductor substrate 11, for example, the gate insulator 21 composed of a silicon oxide film is formed to be 3.5 nm thick by thermal oxidation. The film thickness of the gate insulator 21 is necessary in a range of 1.0 nm-20 nm, preferably 3.0 nm-5.0 nm. Next, the lower portion gate electrode film 22 is deposited on the gate insulator 21 composed of poly-crystalline silicon, to be 80 nm thick, for example, by CVD (Chemical Vapor Deposition).

Next, the poly-crystalline silicon as the lower portion gate electrode film 22 is doped with phosphorous (P) by ion implantation, for example, in a case of n-type transistor. The lower portion gate electrode film 22 doped with phosphorous (P) may be simultaneously deposited in the CVD process.

After processing steps mentioned above, upper portion gate electrode film 23 composed of tungsten-silicon compound (WSi) being 50 nm thick is deposited on the lower portion gate electrode film 22, for example, by sputtering. Next, a cap insulator 25 composed of a silicon nitride film being 200 nm thick is deposited on the upper portion gate electrode film 23, for example, by LPCVD (Low Pressure CVD).

As shown in FIG. 2B, the cap insulator 25 is delineated by lithography and anisotropic etching such as RIE (Reactive Ion Etching) or the like. The upper portion gate electrode film 23, the lower portion gate electrode film 22 and the gate insulator 21 are delineated in order using the cap insulator 25 as a mask by anisotropic etching, so that the gate electrode 24 of a stacked layer structure with the upper portion gate electrode film 23 and the lower portion gate electrode film 22 is formed.

As shown in FIG. 2C, a post-oxide film 26 is formed to be 4.0 nm thick over the surface of the semiconductor substrate 11 under a low pressure by wet RTO (Rapid Thermal Oxidation) so as to cover the gate insulator 21, the gate electrode 24, and the cap insulator 25.

As shown in FIG. 3A, undoped silicon film 27 composed of poly-crystallites is deposited to be 40-50 nm thick, for example, by CVD, to cover the post-oxide film 26. In this case, the silicon film 27 may not restricted to be the poly-crystalline silicon, but may be composed of amorphous silicon.

As shown in FIG. 3B, boron fluoride ($BF_2$) is ion-implanted at an acceleration energy of 5 keV and a dose of 5E14 $cm^{-2}$ from perpendicular (arrow direction) to the surface of the semiconductor substrate 11. The acceleration energy in the ion-irradiation process is set at the amount that the impurity is practically not reached to the surface of the semiconductor substrate 11.

By using the ion-implantation process, an etching rate for an etching solution of an upper portion of the semiconductor substrate 11 and the silicon film 27 of an upper portion of the cap insulator 25, where $BF_2$ is ion-implanted, is later than an etching rate for the etching solution of a side-wall of the gate electrode 24 and the silicon film 27 on a side-wall of the cap insulator 25, where $BF_2$ is not ion-implanted. In addition, the impurity changing the etching rate is not restricted to $BF_2$, for example, boron (B), boron compound or the like may be used.

As shown in FIG. 3C, the semiconductor substrate 11 is etched by alkali solution, for example, trimethylsilane (TMS) solution or potassium hydroxide (KOH) solution so that the gate electrode 24 and the silicon film 27 on the side-wall of the cap insulator 25 where $BF_2$ is ion-implanted are selectively removed.

After processing steps mentioned above, exposed post-oxide film 26 is removed by RIE or the like, for example. As a result, a mask 28 composed of the gate insulator 21 and the silicon film 27 are formed on the surface of the semiconductor substrate 11 and a space 29 is formed between the mask 28 and the side-wall of the gate electrode 24. A width of the space 29, namely, a distance between the mask 28 and the side-wall of the gate electrode 24 has a length of 44 nm-54 nm which is summed up the thicknesses of the silicon film 27 and the post-oxide film 26.

As shown in FIG. 4A, in a case of an n-type transistor, $BF_2$ is ion-implanted from a direction (arrow direction) being inclined approximately 30 degrees from perpendicular to the surface of the semiconductor substrate 11. An acceleration energy and a dose as the conditions of the ion implantation are ranged at 10 keV and between $1E14$-$1E15$ $cm^{-2}$, respectively. Subsequently, a thermal treatment is performed. $BF_2$ is ion-implanted into the semiconductor substrate 11 only from the space 29 between the gate electrode 24 and the mask 28, and the gate electrode 24 and the mask 28 near the space 29. $BF_2$ being ion-implanted into the other portion is stopped by the mask 28 or the gate electrode 24, as a result, $BF_2$ is not ion-implanted into the semiconductor substrate 11.

Accordingly, $BF_2$ is ion-implanted only into both a channel area 13 inside the extend plane A of the side-wall of the gate electrode 24 and a prescribed source/drain region outside the extend plane A. Moreover, p-type, so called, a first conductive impurity region 33 is buried into near the side-wall of the gate electrode 24. The first conductive impurity region 33 is not formed in the other region of the semiconductor substrate 11.

Further, the first conductive impurity region 33 has a concentration profile. In a depth direction perpendicular to the surface of the semiconductor substrate 11, the concentration profile is a mountain-type, namely, high at a center portion and low at a periphery portion at the left side in FIG. 1. Further, in a horizontal direction, as the same as the depth direction to the surface of the semiconductor substrate 11, the concentration profile is a mountain-type, namely, high at a center portion and low at a periphery at the lower side in FIG. 1.

An angle of ion implantation is not necessarily restricted to about 30 degrees from perpendicular to the surface of the semiconductor substrate 11. The first conductive impurities region 33 can be changed to be formed more suitable portion.

As shown in FIG. 4B, a second conductive type, for example, arsenic (As) is ion-implanted with an acceleration energy of 7 keV and a dose of $1E15$ $cm^{-2}$ into the surface of the semiconductor substrate 11 from the perpendicular (arrow direction) to the surface of the semiconductor substrate 11 using the gate electrode 24 as a mask. The source/drain region 31a with low concentration is formed in the surface of the semiconductor substrate 11 by subsequent thermal annealing.

As shown in FIG. 4C, for example, silicon nitride film is deposited to be 5.0 nm-30 nm thick on the surface of the semiconductor substrate 11, for example, by LPCVD, to cover the gate insulator 21, the gate electrode 24 and the cap insulator 25. Subsequently, the silicon nitride film is etched back by RIE having a different selective-ratio to the semiconductor substrate 11 to form the spacer 30 on the side-walls of the gate insulator 21, the gate electrode 24 and the cap insulator 25.

After processing steps mentioned above, for example, As is ion-implanted with an acceleration energy of 5 keV and a dose of $2E15$ $cm^{-2}$ from the perpendicular (arrow direction) to the surface of the semiconductor substrate 11 using the spacer 30 as a mask, subsequently, the source/drain region 31b with a high concentration is formed at a position deeper than the source/drain region 31a with a low concentration by thermal annealing. The source/drain region 31 is composed of the source/drain region 31b with the high concentration and the source/drain region 31a with the low concentration. The source/drain region 31, as shown by the dotted line, is overlapped with the periphery portion of the first conductive impurity region 33 and generates a junction between the first conductive impurity regions 33.

As shown in FIG. 1, an inter-layer dielectric film 41 composed of BPSG (Boron Phosphorus Silicate Glass) is deposited on the semiconductor substrate 11, for example, by CVD. Next, a contact hole 43 is formed in the inter-layer dielectric film 41 on the source/drain region 31 by anisotropic etching. The contact hole 43 is formed between adjacent spacers 30 in self-align. Next, for example, Ti (Ti) and Ti nitride (TiN) are formed in the contact hole 43 by sputtering, subsequently, tungsten (W) is deposited in the contact hole 43. The surface of W layer is polished by CMP (Chemical Mechanical Polishing) to form a contact layer 45 with W in the contact hole 43. After the processing steps mentioned above, the semiconductor device 1 is completed.

In the semiconductor device 1 of the embodiment mentioned above, as the first conductive impurity region 33 having the same conductive type as the channel area 13 is constituted at the channel area 13 under the gate electrode 24 and the channel depth is shallow with increasing the channel concentration, a short-channel effect can be suppressed. Furthermore, in the conventional method, the impurity region is configured with the total source/drain region and has the same impurity concentration in a prescribed region. However, as first conductive impurity region 33 is only constituted near the extend plane A of the side-wall of the gate electrode 24 in this embodiment, a portion of the semiconductor substrate 11 highly concentrated by the first conductive impurity region 33 is less as comparing with the conventional case. Further, as the first conductive impurities region 33 is high at the center portion in the concentration profile at a prescribed depth is decreased towards periphery portion, a diffusion layer capacity is decreased by reduction in near the junction.

Further, in the conventional case, the first conductive impurity region is overlapped with all the source/drain region and has the same impurity concentration at prescribed depth, however, in this embodiment, only the portion of the first conductive impurity region 33 is overlapped with the source/drain region 31. In addition, as the first conductive impurity region 33 has the concentration profile being high at the center portion and decreasing towards the periphery portion at the prescribed portion, the concentration of the portion overlapped with the source/drain region 31 is low so that the diffusion layer resistance in the source/drain region 31 can be decreased.

Accordingly, reduction of the driving force can be suppressed, which leads to the semiconductor device having a capability of high speed.

Further, in the method for fabricating a semiconductor device, the first conductive impurity region 33 is formed by the ion implantation from the space 29 constituted between the mask 28 and the side-wall of the gate electrode 24 after covering the prescribed region of the source/drain region 31 by the mask 28. As a result, the first conductive impurity region 33 having prescribed concentration profile can be only restrictedly constituted under the end of the gate electrode 2.

Furthermore, the mask 28 being composed of the silicon film 27 and having the space 29 between the side-wall of the gate electrodes 24 is deposited on the surface of the semiconductor substrate 11 to cover the gate electrode 24. After changing the etching rate for the etching solution between the silicon film 27 being on the side-wall of the gate electrode 24 and the silicon film 27 being the upper portion of the gate electrode 24 and being the upper portion of the semiconductor substrate 11 by ion-implanting with boron from perpendicular to the surface of the semiconductor substrate 11, the silicon film 27 of the side-wall of the gate electrode 24 is only selectively removed so that the first conductive impurity region 33 is simply formed. Therefore, the semiconductor device with a capability of high speed in this embodiment can be easily fabricated.

Other Embodiments

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

For example, the first conductive impurity region and the source/drain region with the low concentration can be formed by another order. For example, first, the source/drain region with the low concentration can be formed and the first conductive impurity region can be secondly formed.

For another example, the n-type transistor is demonstrated in the embodiment; however, the p-type transistor can be also applied. In a case of the p-type transistor, the impurities used as the case in the n-type transistor are all exchanged to the reverse type.

For further example, in the embodiment, bulk silicon substrate is demonstrated as a semiconductor substrate, however, a SOI (Silicon on Insulator) structure can be used as the substrate.

For further example, in the embodiment, boron is demonstrated as the ion-implanted impurity being ion-implanted into the silicon film, however, arsenic, indium, antimony, phosphorous, boron compounds, arsenic compounds, indium compounds, antimony compounds or phosphorous compounds can be also used.

What is claimed is:

1. A method for fabricating a semiconductor device, comprising:

forming a gate electrode over a surface of a first conductive type semiconductor substrate via a gate insulator;

at least forming a post-oxide film on the side-wall of the gate electrode;

forming a silicon film to cover the post-oxide film and the surface of the semiconductor substrate;

ion-implanting impurities from perpendicular direction to the surface of the semiconductor substrate surface to lower an etching rate by an etching solution at the ion-implanted silicon film as compared with the etching rate by the etching solution at the silicon film of the side-wall of the gate electrode;

removing the silicon film of the side-wall of the gate electrode to form a mask on the gate electrode, the mask including a space under the mask, the space being formed at the removed area after removing the silicon film of the side-wall;

ion-implanting a first conductive impurity into the surface of the semiconductor substrate through the space from a direction inclined with a prescribed angles for perpendicular to the surface of the semiconductor substrate to form the first conductive impurity region, the first conductive impurity region being buried in the semiconductor substrate, the first conductive impurity region being extended at both sides of an extend plane, the extend plane being extended from both the side-wall sides of the gate electrode into the semiconductor substrate; and ion-implanting a second conductive impurity into the surface of the semiconductor substrate using the gate electrode as a mask to form a source/drain region, the source/drain region being extended from an end of the gate electrode at the semiconductor substrate to an outer region in the semiconductor substrate and the source/drain region being partially overlapped with the first conductive impurity region.

2. The method for fabricating the semiconductor device according to claim 1, wherein forming the source/drain region includes ion-implanting the second conductive impurity near the surface of the semiconductor substrate to form a source/drain region with a low concentration, forming a spacer on the side-walls of the gate insulator and the gate electrode and ion-implanting the second conductive impurity under the low concentration source/drain region in the semiconductor substrate to form a source/drain region with a high concentration.

3. The method for fabricating the semiconductor device according to claim 1, wherein the impurity being ion-implanted into the silicon film is at least one of boron, arsenic, indium, antimony, phosphorus, boron compounds, arsenic compounds, indium compounds, antimony compounds or phosphorus compounds.

* * * * *